United States Patent
Chen et al.

(10) Patent No.: US 12,407,300 B2
(45) Date of Patent: Sep. 2, 2025

(54) DIFFERENTIAL SIGNAL AMPLIFICATION CIRCUIT, DIGITAL ISOLATOR, AND DIGITAL RECEIVER

(71) Applicant: SUZHOU NOVOSENSE MICROELECTRONICS CO., LTD., Suzhou (CN)

(72) Inventors: Qihui Chen, Suzhou (CN); Yun Sheng, Suzhou (CN)

(73) Assignee: SUZHOU NOVOSENSE MICROELECTRONICS CO., LTD., Suzhou (CN)

( * ) Notice: Subject to any disclaimer, the term of this patent is extended or adjusted under 35 U.S.C. 154(b) by 362 days.

(21) Appl. No.: 17/926,616

(22) PCT Filed: Feb. 7, 2021

(86) PCT No.: PCT/CN2021/075836
§ 371 (c)(1),
(2) Date: Nov. 20, 2022

(87) PCT Pub. No.: WO2021/232861
PCT Pub. Date: Nov. 25, 2021

(65) Prior Publication Data
US 2023/0188097 A1    Jun. 15, 2023

(30) Foreign Application Priority Data
May 20, 2020  (CN) .......................... 202010430520.1

(51) Int. Cl.
H03F 1/26      (2006.01)
H03F 3/45      (2006.01)
H04B 1/16      (2006.01)

(52) U.S. Cl.
CPC ........... *H03F 1/26* (2013.01); *H03F 3/45632* (2013.01); *H03F 2200/372* (2013.01); *H03F 2203/45454* (2013.01); *H04B 1/16* (2013.01)

(58) Field of Classification Search
CPC .. H03F 1/26; H03F 3/45632; H03F 2200/372; H03F 2203/45454;
(Continued)

(56) References Cited

U.S. PATENT DOCUMENTS 5,381,113 A    1/1995   Kimura
7,893,766 B1 *  2/2011   Cranford, Jr. ....... H03F 3/45183
                                                   330/261
(Continued)

FOREIGN PATENT DOCUMENTS

CN    103222188 A    7/2013
CN    107765751 A    3/2018
CN    111446935 A    7/2020

OTHER PUBLICATIONS

Chang et al., "A Global Operational Amplifier with Constant-gm Input and Output Stage," 1999 IEEE Tencon, 1999, pp. 1051-1054.
(Continued)

*Primary Examiner* — Hieu P Nguyen
(74) *Attorney, Agent, or Firm* — Birch, Stewart, Kolasch & Birch, LLP (57) ABSTRACT

The present invention discloses a differential signal amplification circuit as well as a digital isolator and a digital receiver applying the differential signal amplification circuit, wherein the differential signal amplification circuit includes a multi-stage differential amplifier and a common-mode transient adaptive biasing circuit. The common-mode transient adaptive biasing circuit is configured to detect a positive or negative common-mode transient interference signal at a positive input terminal and a negative input terminal, and provide a biasing current of a differential
(Continued)

amplifier of at least one stage above a second stage when the positive or negative common-mode transient interference signals are detected. With the technical solutions of the present invention, abnormal signal transmission caused by the common-mode interference signals can be suppressed.

13 Claims, 8 Drawing Sheets

(58) Field of Classification Search
CPC ............ H03F 3/45717; H03F 2200/42; H03F 2203/45051; H03F 2203/45451; H03F 2203/45476; H03F 2203/45596; H03F 3/45183; H03F 2200/271; H03F 2200/48; H03F 2203/45156; H03F 2203/45544; H03F 2203/45631; H03F 2203/45702; H03F 3/45708; H03F 3/45479; H04B 1/16; H04B 1/1027; H04B 1/40; H03K 19/017545; H03K 19/018557; H03K 19/00315; H03K 19/00361

USPC .......................................... 330/252–261, 136
See application file for complete search history.

(56) References Cited

U.S. PATENT DOCUMENTS

| | | |
|---|---|---|
| 9,106,186 B1 | 8/2015 | Signoff et al. |
| 10,236,878 B1 * | 3/2019 | Chen ..................... H02M 3/158 |
| 10,659,173 B1 | 5/2020 | Li et al. |
| 2009/0243028 A1 | 10/2009 | Dong et al. |
| 2011/0001565 A1 | 1/2011 | Sutardja |
| 2013/0169361 A1 | 7/2013 | Killat |
| 2016/0079931 A1 | 3/2016 | Tsai et al. |
| 2019/0199290 A1 | 6/2019 | Karmaker et al. |

OTHER PUBLICATIONS

Coban et al., "Low-Voltage Analog IC Design in CMOS Technology," IEEE Transactions on Circuits and Systems 1: Fundamental Theory and Applications, 1995, pp. 955-958.

* cited by examiner

DIFFERENTIAL SIGNAL AMPLIFICATION CIRCUIT, DIGITAL ISOLATOR, AND DIGITAL RECEIVER

CROSS-REFERENCE TO RELATED APPLICATION

This application is a 35 U.S.C. § 371 National Phase conversion of International (PCT) Patent Application No. PCT/CN2021/075836, filed on Feb. 7, 2021, which claims priority to Chinese Patent Application No. 202010430520.1, filed on May 20, 2020, and entitled "DIFFERENTIAL SIGNAL AMPLIFICATION CIRCUIT, DIGITAL ISOLATOR, AND DIGITAL RECEIVER", which is incorporated herein by reference in its entirety. The PCT International Patent Application was filed and published in Chinese.

TECHNICAL FIELD

The present invention relates to the field of electrical coupling apparatuses, and in particular, to a differential signal amplification circuit, a digital isolator, and a digital receiver.

BACKGROUND

A digital isolation circuit is used to provide an intermediate circuit between a digital signal transmitting circuit and a digital signal receiving circuit. The isolation circuit enables communications between different electrical devices, such as communications between a weak-current circuit and a strong-current circuit, while preventing mutual interference between different circuits.

Figure 1:
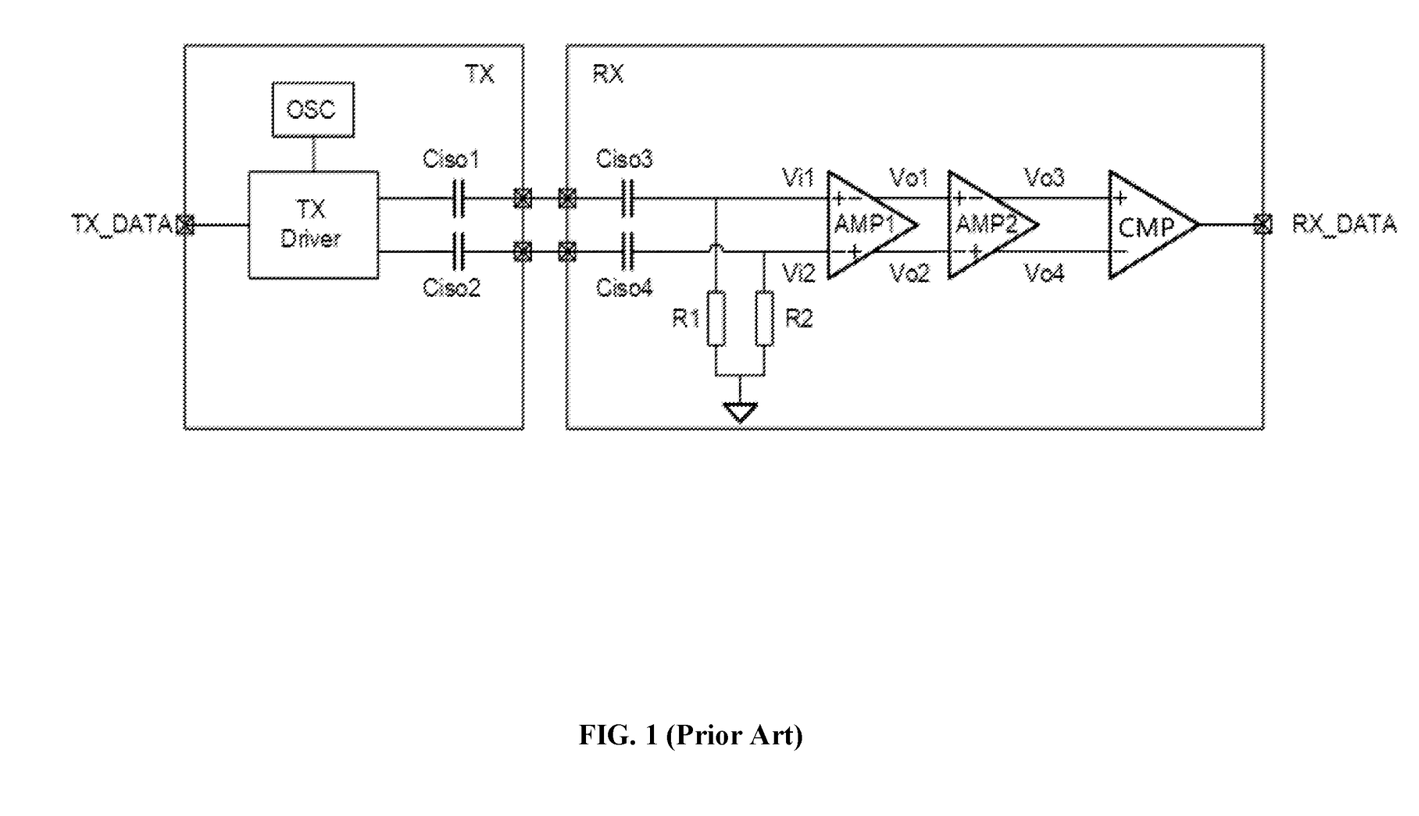
FIG. 1 is a schematic diagram of a digital isolator in the prior art.

FIG. 1 shows an implementation of a traditional digital isolator, which adopts an OOK modem technology and consists of a transmitting circuit TX and a receiving circuit RX. High and low levels in a digital signal are transmitted by sending and not sending a high-frequency clock signal.

Circuit elements of the transmitting circuit TX and the receiving circuit RX are connected as shown in FIG. 1. The transmitting circuit TX includes a digital signal input terminal TX_DATA, an oscillator OSC, and isolation capacitors Ciso1 and Ciso2. The receiving circuit RX includes isolation capacitors Ciso3 and Ciso4, two-stage amplification circuits AMP1 and AMP2, capacitors C3 and C4, a comparator CMP, and grounded resistors R1 and R2.

The isolation capacitors Ciso1 and Cios3 as well as Cios2 and Cios4 are connected by wirings Wire1 and Wire2 respectively.

When a common-mode transient interference signal occurs between TX and RX, there may be common-mode currents I1 and I2 flowing through the isolation capacitors Ciso1-Ciso4 respectively to form direct-current voltages Vi1 and Vi2 on the resistors R1 and R2. When the common-mode transient interference signals occur, Vi1 and Vi2 may generate comparatively large direct-current offset voltages. After amplified by AMP1, the direct-current offset voltages Vo1 and Vo2 become larger relative to Vi1 and Vi2, resulting in reduced AMP2 gain and output swing and abnormal signal transmission functions.

SUMMARY

The object of the present invention is to solve the problem that an input voltage of the amplification circuit described above further results in abnormal signal transmission functions due to the direct-current offset voltages caused by common-mode interference.

To achieve the above inventive object, in an embodiment of the present invention, a differential signal amplification circuit is provided, comprising a multi-stage differential amplifier and a common-mode transient adaptive biasing circuit, wherein a positive input terminal and a negative input terminal of a primary differential amplifier of the multi-stage differential amplifier are connected to an input terminal of the common-mode transient adaptive biasing circuit; and the common-mode transient adaptive biasing circuit is configured to detect a positive or negative common-mode transient interference signal at the positive input terminal and the negative input terminal, and provide a biasing current of a differential amplifier of at least one stage above a second stage when the positive or negative common-mode transient interference signals are detected.

As a further improvement of an embodiment of the present invention, the common-mode transient adaptive biasing circuit comprises a common-mode detection circuit and an adaptive biasing circuit, wherein the common-mode detection circuit is connected to the positive input terminal and the negative input terminal of the primary differential amplifier respectively; and when the common-mode detection circuit detects the positive or negative common-mode transient interference signals at the positive input and the negative input, the adaptive biasing circuit is turned on to form a biasing current loop by the adaptive biasing circuit and the multi-stage differential amplifier.

As a further improvement of an embodiment of the present invention, the common-mode detection circuit is configured to detect the positive common-mode transient interference signals, and comprises an NMOS transistor MC1 and an NMOS transistor MC2 that are connected in parallel, wherein gate electrodes of the NMOS transistor MC1 and the NMOS transistor MC2 are respectively connected to the positive input terminal and the negative input terminal of the primary differential amplifier; drain electrodes of the NMOS transistor MC1 and the NMOS transistor MC2 are connected to a biasing current output terminal of the multi-stage differential amplifier; and source electrodes of the NMOS transistor MC1 and the NMOS transistor MC2 are connected to a current input terminal of the adaptive biasing circuit.

As a further improvement of an embodiment of the present invention, the adaptive biasing circuit comprises an NMOS transistor MC3 and an NMOS transistor MC4 having their source electrode and the drain electrode connected in series, wherein the drain electrode and the gate electrode of the NMOS transistor MC3 are connected to an output terminal of the common-mode detection circuit; and the source electrode of the NMOS transistor MC4 is connected to ground.

As a further improvement of an embodiment of the present invention, the common-mode detection circuit is configured to detect the negative common-mode transient interference signals, and comprises:

a PMOS transistor MD4 and an NMOS transistor MD3 whose drain electrodes are connected in series, wherein a source electrode of the PMOS transistor MD4 is connected to a power supply; and a PMOS transistor MD1 and a PMOS transistor MD2 that are connected in parallel, wherein source electrodes of the PMOS transistor MD1 and the PMOS transistor MD2 are connected to source electrode of the NMOS transistor MD3;

gate electrodes of the PMOS transistor MD1 and the PMOS transistor MD2 are respectively connected to the positive input terminal and the negative input terminal of the primary differential amplifier; and drain electrodes of the PMOS transistor MD1 and the PMOS transistor MD2 are connected to a signal input terminal of the adaptive biasing circuit.

As a further improvement of an embodiment of the present invention, the adaptive biasing circuit is a current mirror in structure, and a mirroring current output terminal of the current mirror is connected to a biasing current output terminal of the multi-stage differential amplifier.

As a further improvement of an embodiment of the present invention, the adaptive biasing circuit comprises an NMOS transistor MD5 and an NMOS transistor MD6 having their gate electrodes connected, wherein source electrodes of the NMOS transistor MD5 and the NMOS transistor MD6 are connected to ground; a drain electrode and a gate electrode of the NMOS transistor MD5 are connected to a signal output terminal of the adaptive biasing circuit; and a drain electrode of the NMOS transistor MD6 is connected to the biasing current output terminal of the multi-stage differential amplifier.

As a further improvement of an embodiment of the present invention, the differential amplifier is a mirroring circuit, wherein the mirroring circuit comprises a PMOS transistor MA3 and an NMOS transistor MA1 whose drain electrodes are connected in series on one side, wherein a source electrode of the PMOS transistor MA3 is connected to a power supply, a capacitor is connected between a gate electrode and the source electrode of the PMOS transistor MA3, and a biasing resistor RA1 is connected between the gate electrode and a drain electrode of the PMOS transistor MA3; and a drain electrode of the NMOS transistor MA1 is connected to a negative output terminal of the differential amplifier, and a gate electrode of the NMOS transistor MA1 is connected to the positive input terminal of the differential amplifier; and the mirroring circuit comprises a PMOS transistor MA4 and an NMOS transistor MA2 whose drain electrodes are connected in series on the other side.

wherein a source electrode of the PMOS transistor MA4 is connected to the power supply, a capacitor CA2 is connected between a gate electrode and the source electrode of the PMOS transistor MA4, and a biasing resistor RA2 is connected between the gate electrode and a drain electrode of the PMOS transistor MA4; and a drain electrode of the NMOS transistor MA2 is connected to a positive output terminal of the differential amplifier, and a gate electrode of the NMOS transistor MA2 is connected to the negative input terminal of the differential amplifier; and the source electrodes of the PMOS transistor MA3 and the PMOS transistor MA4 on both sides of the mirroring circuit are connected in parallel, the source electrodes of the NMOS transistor MA1 and the NMOS transistor MA2 on both sides of the mirroring circuit are connected in parallel, and the source electrodes of the NMOS transistor MA1 and the NMOS transistor MA2 are connected to a drain electrode of a grounded NMOS transistor MA5.

As a further improvement of an embodiment of the present invention, the differential amplifiers above the second stage comprises at least one stage of differential amplifier in which the source electrodes of the NMOS transistor MA1 and the NMOS transistor MA2 are connected to the biasing current output terminal.

As a further improvement of an embodiment of the present invention, the positive input terminal and the negative input terminal of the primary differential amplifier are respectively connected with a resistor R3 and a resistor R4 to a reference level.

As a further improvement of an embodiment of the present invention, the positive input terminal and the negative input terminal of the primary differential amplifier are connected to an isolation capacitor Ciso3 and an isolation capacitor Ciso4 in series.

To achieve the above inventive object, in an embodiment of the present invention, a receiver for a digital isolator is provided. Based on the same technical improvements, the present invention provides the receiver for the digital isolator including the differential signal amplification circuit, wherein the positive input terminal and the negative input terminal of the primary differential amplifier are connected to a positive input terminal and a negative input terminal of the digital isolator; the output terminal of the multi-stage differential amplifier is connected to an input terminal of a comparator; and an output terminal of the comparator is connected to an output terminal of the receiver for the digital isolator.

To achieve the above inventive object, in an embodiment of the present invention, a digital isolator is provided. The digital isolator includes a transmitter and a receiver, wherein the transmitter includes an oscillator and a transmission driving circuit, the transmission driving circuit having an oscillating signal input terminal connected to the oscillator, a digital signal input terminal connected to a digital signal input terminal of the transmitter, and an output terminal connected to an output terminal of the transmitter; and the receiver includes a differential signal amplification circuit and a comparison circuit, the differential signal amplification circuit having an input terminal connected to an input terminal of the receiver and an output terminal connected to an input terminal of the comparison circuit, and an output terminal of the comparison circuit connected to a digital output terminal of the receiver.

The differential signal amplification circuit includes a multi-stage differential amplifier and a common-mode transient adaptive biasing circuit, wherein a positive input terminal and a negative input terminal of a primary differential amplifier of the multi-stage differential amplifier are connected to an input terminal of the common-mode transient adaptive biasing circuit; and the common-mode transient adaptive biasing circuit is configured to detect a positive or negative common-mode transient interference signal at the positive input terminal and the negative input terminal, and provide a biasing current of a differential amplifier of at least one stage above a second stage when the positive or negative common-mode transient interference signals are detected.

Compared with the prior art, with the technical solutions of the present invention, abnormal signal transmission caused by the common-mode interference signals can be suppressed.

DETAILED DESCRIPTION

Preferred embodiments of the technical solutions of the present invention are described below in detail in conjunction with the accompanying drawings to help understanding of the technical solutions of the present invention by those skilled in the art.

Figure 2:
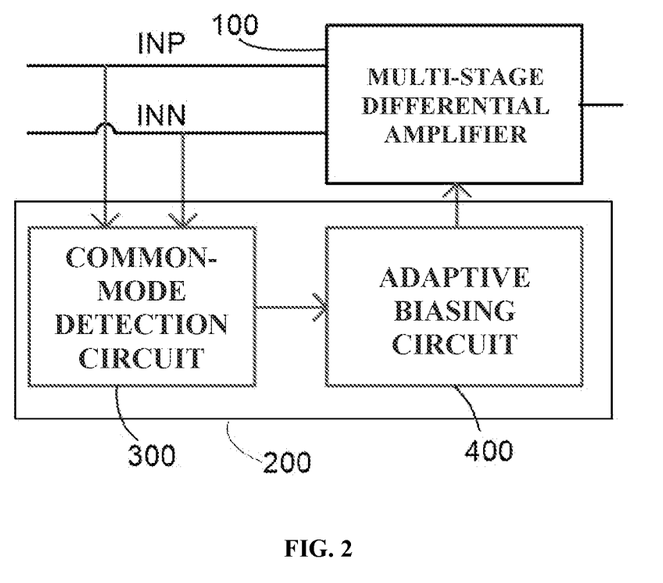
FIG. 2 is a schematic diagram of a frame structure of a differential signal amplification circuit.

FIG. 2 shows an architecture diagram of a differential signal amplification circuit, including a multi-stage differential amplifier 100 and a common-mode transient adaptive biasing circuit (CMTI) 200 for providing a biasing current of the multi-stage differential amplifier 100.

The multi-stage differential amplifier 100 includes at least a two-stage differential amplifier. An input terminal of the common-mode transient adaptive biasing circuit 200 is connected to a positive input terminal INP and a negative input terminal INN of the multi-stage differential amplifier. A positive or negative common-mode interference signal generated on the input terminals is input into the common-mode transient adaptive biasing circuit 200. The common-mode transient adaptive biasing circuit 200 detects the positive or negative common-mode transient interference signals at the positive input terminal INP and the negative input terminal INN, determines that an effective positive or negative common-mode transient interference signal is detected after the common-mode transient interference signal reaches a starting voltage of the common-mode transient adaptive biasing circuit 200, and provides a biasing current of a differential amplifier of at least one stage above a second stage when the positive or negative common-mode transient interference signals are detected.

When common-mode transient interference occurs, the multi-stage amplification circuit inputs a direct-current offset voltage, and the offset voltage further becomes larger after amplified by a primary amplifier, resulting in the offset voltage being transferred along the multi-stage amplification circuit and eventually leading to abnormal signal transmission. In this solution, the common-mode transient adaptive biasing circuit 200 is capable of compensating for amplifier output loss caused by the occurrence of the positive or negative common-mode transient interference signals. When a primary offset voltage occurs, a positive or negative input voltage and a reverse input voltage of a primary amplification circuit are increased. When the voltages change to exceed a starting voltage of the common-mode transient adaptive biasing circuit, the common-mode transient adaptive biasing circuit 200 provides a current in a differential amplifier above the second stage by providing the biasing currents. The differential currents compensate for reduced output swing and gain loss of the differential amplifiers caused by voltage imbalance, and avoid continuous transfer of the direct-current input voltage mismatch caused by the common-mode signals between second-stage differential amplifiers or the differential amplifiers above the second stage. Therefore, the interference caused by the common-mode signals to signal transmission is suppressed. With this method, the common-mode transient adaptive biasing circuit 200 may compensate for the differential amplifiers of each stage or unspecified number of stages above a second-stage amplification circuit.

Figure 3:
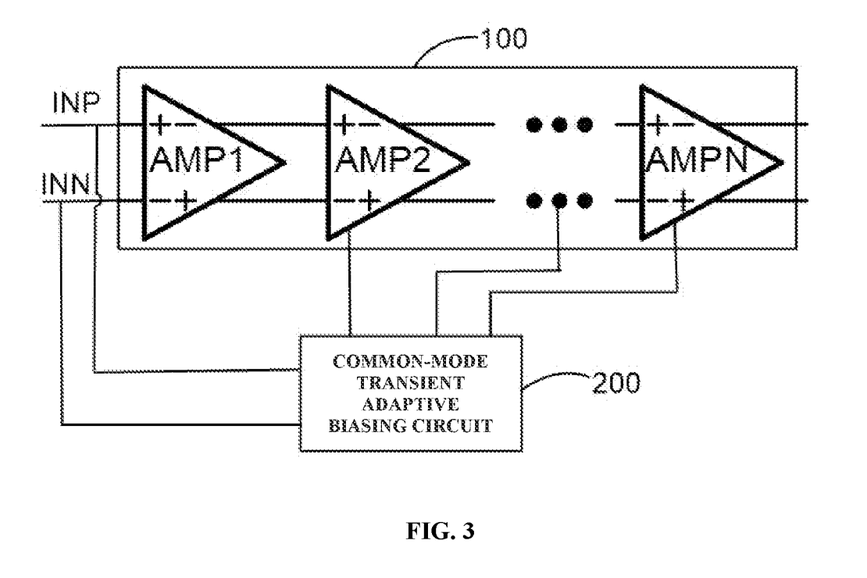
FIG. 3 is a schematic structural diagram of connections of a multi-stage differential amplifier.

With reference to FIG. 3, the multi-stage amplification circuit 100 includes a plurality of differential amplifiers AMP1 to AMPN having inputs and outputs connected in series. The positive input terminal INP and the negative input terminal INN of the primary differential amplifier AMP1 serve as input terminals of the multi-stage amplification circuit. Optionally, a biasing current output terminal of any number of amplifiers in AMP2 to AMPN is connected to the common-mode transient adaptive biasing circuit 200. The common-mode transient adaptive biasing circuit 200 may adjust the biasing currents of a plurality of differential amplifiers simultaneously. With regard to the order of connection, the differential amplifiers may be connected to the common-mode transient adaptive biasing circuit in the order of AMP2, AMP3, AMP4, AMP5 . . . AMPN. Alternatively, the differential amplifiers may be connected to the common-mode transient adaptive biasing circuit every other stage in the order of AMP2, AMP4, AMP6, AMP8 . . . AMP2$n$ or by any other electrical connection method known by those skilled in the art. The number of the common-mode transient adaptive biasing circuits 200 is not limited to one as shown in FIG. 3, but may be multiple. In this case, a connection relationship between the common-mode transient adaptive biasing circuits 200 and the multi-stage differential amplifiers AMP1 to AMPN is one-to-one connection or one-to-many connection or many-to-one connection or many-to-many connection. With such a connection solution, the common-mode transient adaptive biasing circuits may provide compensation for the biasing currents of a one-stage or multi-stage differential amplifier simultaneously.

Figure 4:
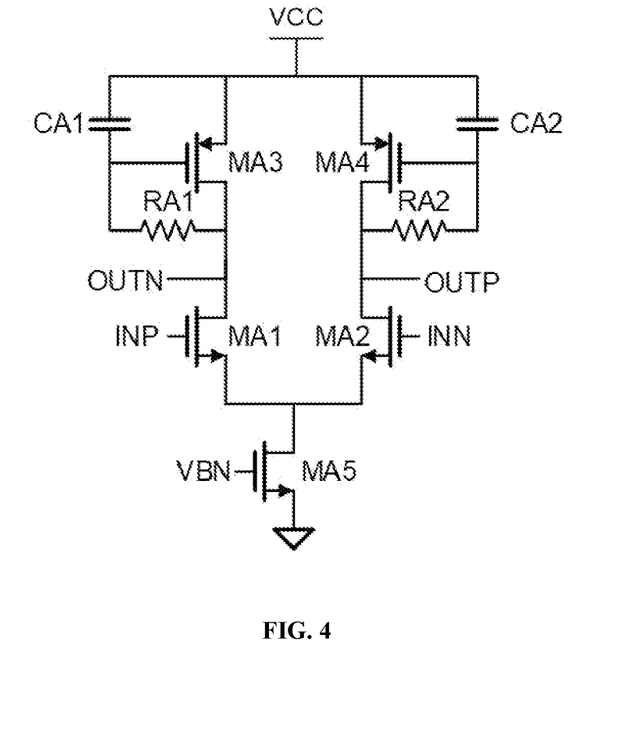
FIG. 4 is a schematic structural diagram of a primary differential amplification circuit.

FIG. 4 is a schematic structural diagram of the primary differential amplifier AMP1 in the multi-stage amplification circuit. A biasing current output terminal IBCMTI is added in FIG. 5 in addition to those shown in FIG. 4. Among the differential amplifiers AMP1 to AMPN, at least one stage of the differential amplifiers is provided with the biasing current output terminal IBCMTI shown in FIG. 5.

Figure 5:
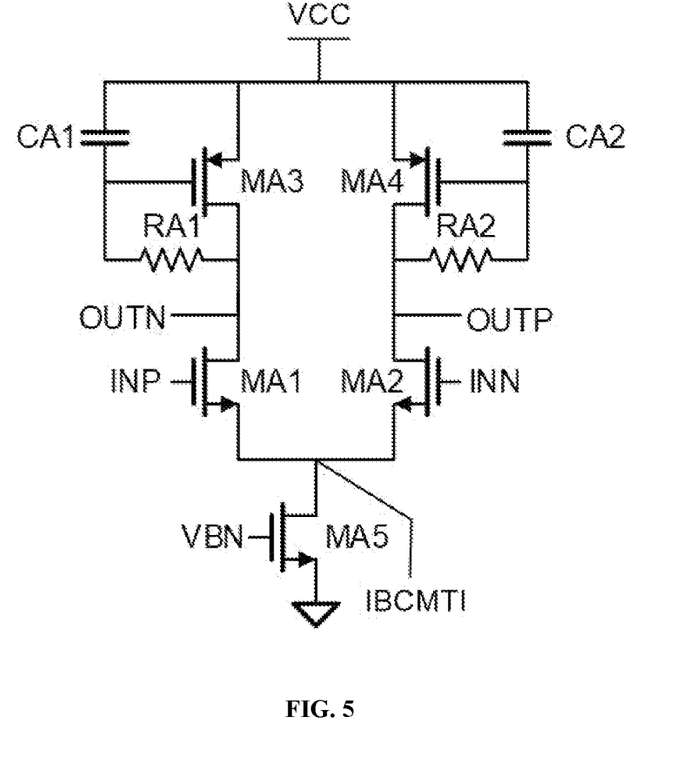
FIG. 5 is a schematic structural diagram of a differential amplification circuit above a second stage with a biasing current output terminal.

With reference to FIG. 5, a differential amplification circuit is composed of a plurality of basic elements connected in a mirrored manner. The mirroring circuit includes a PMOS transistor MA3 and an NMOS transistor MA1 with their drain electrodes connected in series on the left side. The source electrode of the PMOS transistor MA3 is connected to a power supply VCC, a capacitor CA1 is connected between the gate electrode and the source electrode of the PMOS transistor MA3, and a biasing resistor RA1 is connected between the gate electrode and the drain electrode of the PMOS transistor. The drain electrode of the NMOS transistor MA1 is connected to a negative output terminal OUTN of the differential amplifier, and the gate electrode of the NMOS transistor MA1 is connected to the positive input terminal INP of the differential amplifier. The mirroring structure includes a PMOS transistor MA4 and an NMOS transistor MA2 with their drain electrodes connected in series on the right side. The source electrode of the PMOS transistor MA4 is connected to the power supply VCC, a capacitor CA2 is connected between the gate electrode and the source electrode of the PMOS transistor MA4, and a biasing resistor RA2 is connected between the gate electrode and the drain electrode of the PMOS transistor MA4. The drain electrode of the NMOS transistor MA2 is connected to a positive output terminal OUTP of the differential amplifier, and the gate electrode of the NMOS transistor MA2 is connected to the negative input terminal INN of the differential amplifier.

The source electrodes of the PMOS transistor MA3 and the PMOS transistor MA4 on both sides of the mirroring circuit are connected in parallel, the source electrodes of the NMOS transistor MA1 and the NMOS transistor MA2 on both sides of the mirroring circuit are connected in parallel, and the source electrodes of the NMOS transistor MA1 and the NMOS transistor MA2 are connected to the drain electrode of a grounded NMOS transistor MA5. The gate electrode of the grounded NMOS transistor MA5 is connected to a reference level VBN to provide a biasing current required by the amplifier during normal operation.

The source electrode of the NMOS transistor MA1/MA2 is connected to the biasing current output terminal IBCMTI. When the biasing currents are output, mirroring currents on both sides of the differential circuit are increased, and the difference in output potentials between the positive output terminal OUTP and the negative output terminal OUTN of the differential amplification circuit becomes larger. That is, the corresponding output signal waveform swing becomes larger. Among the multi-stage differential amplifiers AMP2 to AMPN, the amplifiers having at least one stage are provided with the biasing current output terminals IBCMTI. The biasing current output terminals IBCMTI at different stages are connected to the common-mode transient adaptive biasing circuit 200 to form multi-stage output gain and swing compensation.

Figure 6:
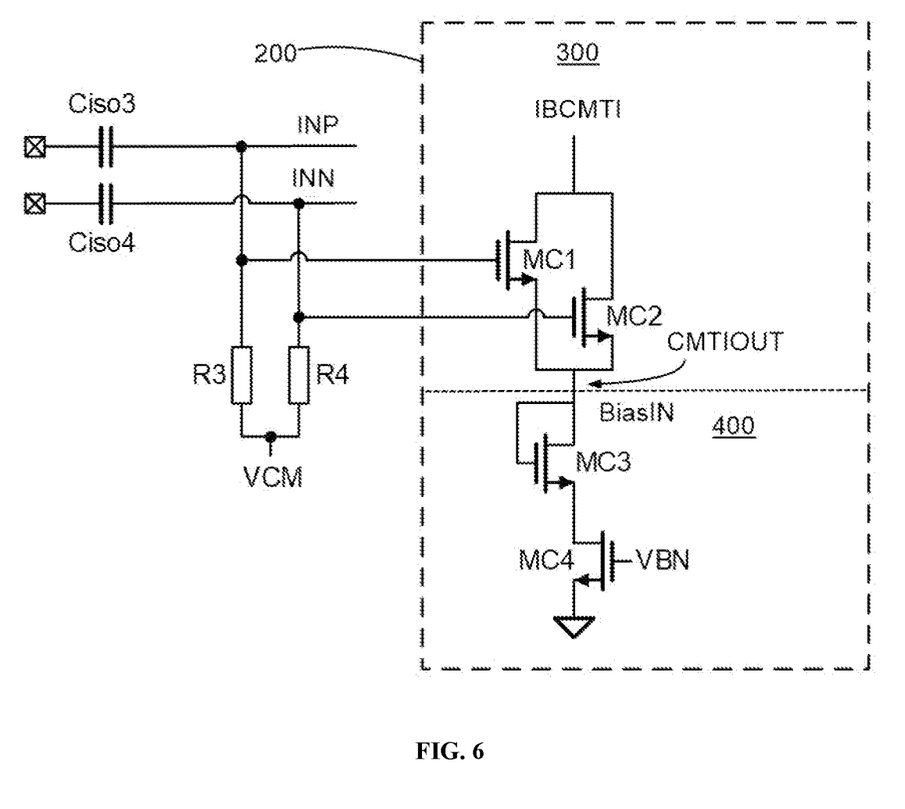
FIG. 6 is a schematic diagram of a common-mode transient adaptive biasing circuit.
Figure 7:
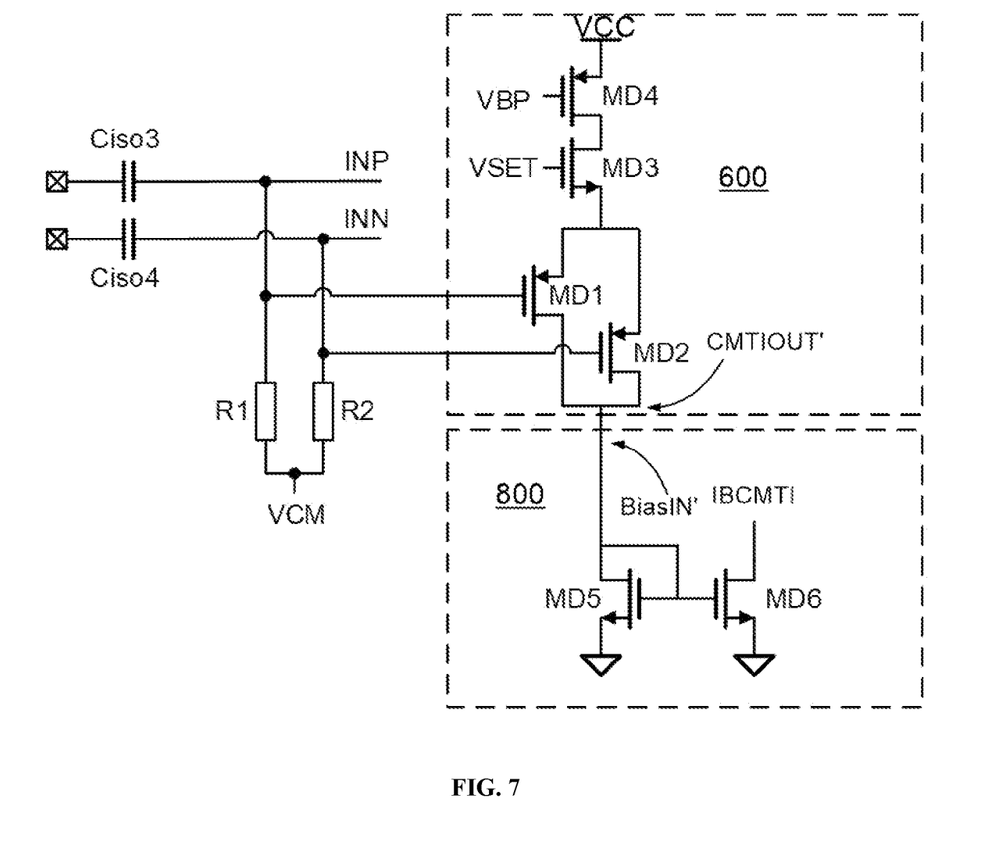
FIG. 7 is a schematic diagram of a common-mode transient adaptive biasing circuit according to another embodiment.

FIGS. 6 and 7 show two embodiments of the common-mode transient adaptive biasing circuit. The common-mode transient adaptive biasing circuit shown in FIG. 6 is configured to detect and suppress the positive common-mode transient interference signals. The common-mode transient adaptive biasing circuit shown in FIG. 7 is configured to detect and suppress the negative common-mode transient interference signals. For positive and negative common-mode transient adaptive biasing circuits, one of them may be used separately to be connected to the multi-stage differential amplifier 100, or both of them are connected in parallel and connected to the multi-stage differential amplifier 100 simultaneously for use.

With reference to the common-mode transient adaptive biasing circuit 200 shown in FIG. 6, it is connected to the input terminals of the primary amplifier. The positive input terminal INP and the negative input terminal INN of the primary amplifier AMP1 are connected to a positive input terminal RXINP and a negative input terminal RXINN of the receiver described below by isolation capacitors Ciso3 and Ciso4. The positive input terminal and the negative input terminal of the primary amplifier are connected to a level VCM by resistors R3 and R4. When the common-mode signals occur, direct-current voltages Vi1 and Vi2 are formed on the resistors R3 and R4. The adaptive biasing circuit detects the direct-current voltages Vi1 and Vi2, and determines whether common-mode interference occurs based on values of the direct-current voltages Vi1 and Vi2.

The common-mode transient adaptive biasing circuit 200 includes a common-mode detection circuit 300 and an adaptive biasing circuit 400. The common-mode detection circuit 300 includes an NMOS transistor MC1 and an NMOS transistor MC2 that are connected in parallel. The gate electrodes of the two NMOS transistors, as the input terminals of the common-mode transient adaptive biasing circuit, are respectively connected to the positive input terminal INP and the negative input terminal INN of the primary differential amplifier. The drain electrode of the NMOS transistor MC1/MC2 is connected to the biasing current output terminal IBCMTI of the differential amplification circuit, and the source electrodes of the NMOS transistor MC1 and the NMOS transistor MC2 are connected to a current input terminal BiasIN of the adaptive biasing circuit.

The adaptive biasing circuit 400 includes an NMOS transistor MC3 and an NMOS transistor MC4 having their source electrode and the drain electrode connected in series. The drain electrode and the gate electrode of the NMOS transistor MC3 are connected to an output terminal CMTIOUT of the common-mode detection circuit 300, and the source electrode of the NMOS transistor MC4 is connected to the ground. The gate electrode of the grounded NMOS transistor MC4 is connected to the reference level VBN for generating the biasing currents for compensating.

Since the gate electrode of the NMOS transistor MC3 is connected to the output terminal CMTIOUT of the common-mode detection circuit 300, the starting voltage of the common-mode transient adaptive biasing circuit is the sum of threshold voltages of the NMOS transistor MC1 or MC2 and the NMOS transistor MC3.

When the common-mode direct-current voltage Vi1 or Vi2 formed by the common-mode interference signals on the grounded resistor R3 or R4 is greater than the starting voltage, the NMOS transistors of the common-mode detection circuit 300 are turned on, so that the adaptive biasing circuit 400 is communicated with the biasing current output terminal IBCMTI. The common-mode detection circuit 300 causes the adaptive biasing circuit 400 to form a biasing current loop with at least one of the differential amplifiers AMP2 . . . AMPN. A biasing current is formed in the adaptive biasing current loop. The currents at the biasing current output terminal IBCMTI flow through the adaptive biasing circuit 400 to the ground. The biasing currents increase the currents of the mirroring circuit in the differential amplifier, so that the gain and output swing of the corresponding differential amplifier are increased, thereby compensating for output direct-current imbalance of the primary differential amplifier. The increase in output swing of the differential signal amplification circuit eliminates the influence of common-mode signal interference.

With reference to the negative common-mode transient adaptive biasing circuit shown in FIG. 7, it is connected to the input terminals of the primary amplification circuit, and it is connected to the positive common-mode transient adaptive biasing circuit 200 shown in FIG. 6 in parallel. Moreover, it is connected to the positive input terminal INP or the negative input terminal INN of the primary differential amplifier AMP1 as well as the resistor R1 or R2 in the same manner as that in which it is connected to the positive common-mode transient adaptive biasing circuit shown in FIG. 6.

The common-mode transient adaptive biasing circuit shown FIG. 7 includes a common-mode detection circuit 600 and an adaptive biasing circuit 800. The common-mode detection circuit 600 includes a PMOS transistor MD4 and an NMOS transistor MD3 whose drain electrodes are connected in series are provided. The source electrode of the PMOS transistor MD4 is connected to the power supply VCC, and the gate electrodes of the PMOS transistor MD4 and the NMOS transistor MD3 are respectively connected to a level VBP and a level VSET. The common-mode detection circuit 600 includes a PMOS transistor MD1 and a PMOS transistor MD2 connected in parallel having their source electrodes connected to the source electrode of the NMOS transistor MD3, the gate electrodes of the PMOS transistor MD1 and the PMOS transistor MD2 are respectively connected to the positive input terminal INP and the negative input terminal INN of the primary differential amplifier AMP1, and the drain electrodes of the PMOS transistor MD1 and the PMOS transistor MD2 are connected to a signal input terminal BiasIN' of the adaptive biasing circuit 800.

The common-mode detection circuit 600 may detect the negative common-mode transient interference signals and adaptively adjust the biasing currents. The PMOS transistor MD4 generates a biasing current according to the level VBP, the PMOS transistor MD1 and the PMOS transistor MD2 detect a common-mode voltage, and when VCM is less than VSET minus a threshold voltage of MD3 and a threshold voltage of MD1 or MD2 (i.e., VCM<VSET−|Vth_MD3|−Vth_MD1, or VCM<VSET−|Vth_MD3|−Vth_MD2), an adaptive biasing current is switched on. A current signal output is generated at an output terminal CMTIOUT' of the common-mode detection circuit.

With continuing reference to FIG. 7, the adaptive biasing circuit 800 is a current mirror in structure. A mirroring current output terminal of the current mirror is connected to the biasing current output terminal IBCMTI of the multi-stage differential amplifier 100. The adaptive biasing circuit includes an NMOS transistor MD5 and an NMOS transistor MD6 having their gate electrodes connected, and source electrodes of the NMOS transistor MD5 and the NMOS transistor MD6 are connected to the ground. The drain electrode and the gate electrode of the NMOS transistor MD5 are connected to the signal output terminal CMTIOUT' of the adaptive biasing circuit 800. The drain electrode of the NMOS transistor MD6 is connected to the biasing current output terminal IBCMTI of the multi-stage differential amplifier 100.

After the common-mode detection circuit 600 is turned on, a current signal passes through the gate electrodes of the NMOS transistor MD5 and NMOS transistor MD6 and forms a mirroring current at the drain electrode of the NMOS transistor MD6. The mirroring currents increase the currents of the mirroring circuit in the multi-stage differential amplifier 100, so that the gain and output swing of the corresponding differential amplifier are increased, eliminating the influence of common-mode signal interference.

Figure 8:
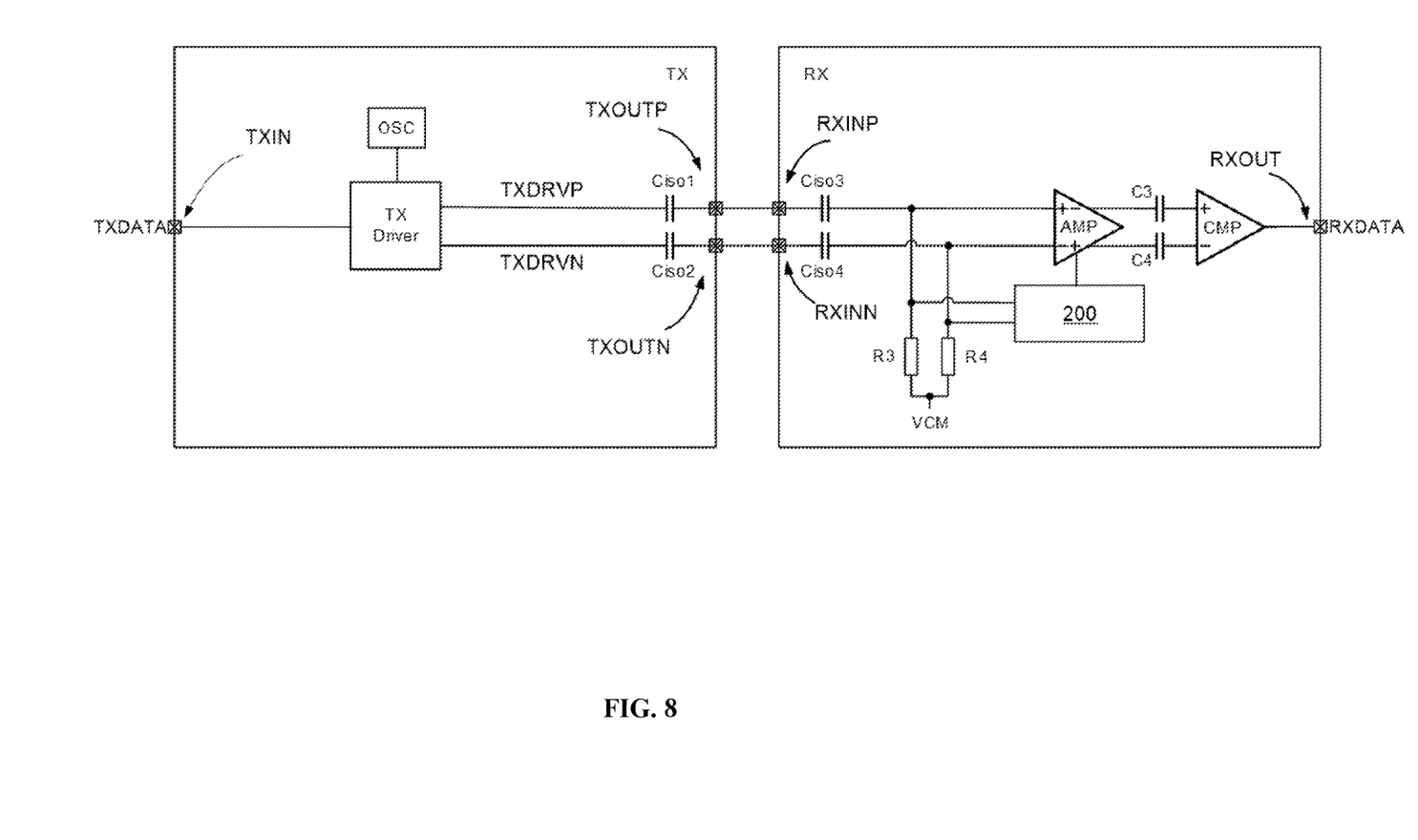
FIG. 8 is a schematic structural diagram of an isolation terminal of a digital receiver.

FIG. 8 shows a digital isolator including a transmitter TX and a receiver RX isolated by capacitors. The digital isolator includes isolation capacitors Ciso1 and Ciso2 connecting a positive output terminal TXOUTP and a negative output terminal TXOUTN of the transmitter, and isolation capacitors Ciso3 and Ciso4 connecting a positive input terminal RXINP and a negative input terminal RXINN of the receiver. The positive output terminal TXOUTP of the transmitter TX and the positive input terminal RXINP of the receiver as well as the negative output terminal TXOUTN of the transmitter and the negative input terminal RXINN of the receiver are connected by wiring. It would be readily occurred to those skilled in the art that means of isolating may also include optical isolation, resistive isolation, and inductive isolation.

The transmitter TX includes an oscillator OSC and a transmission driving circuit TXDriver. The transmission driving circuit modulates and transmits an OOK modulation signal. An oscillating signal input terminal of the transmission driving circuit TXDriver is connected to the oscillator OSC, a digital input terminal of the transmission driving circuit is connected to a digital signal input terminal TXIN of the transmitter, and an output terminal TXDRVP/TXDRVN of the transmission driving circuit is connected to the output terminal TXOUTP/TXOUTN of the transmitter. The oscillator OSC generates a carrier signal. A switching device within the transmission driving circuit TXDriver is driven by a digital signal TXDATA input from the digital signal input terminal TXIN. When the digital signal is in a high level, the transmission driving circuit TXDriver output, at the positive and negative output terminals, a high-frequency signal generated by the oscillator. When the digital signal is in a low level, the transmission driving circuit does not output a signal. Thus, a binary signal is enabled to be loaded onto a high-frequency carrier.

The receiver RX includes a multi-stage differential signal amplification circuit and a comparison circuit CMP and is configured to receive demodulated OOK modulation signal. Positive and negative input terminals of the differential signal amplification circuit are connected to the input terminal RXINP of the receiver. An output terminal of the multi-stage amplification circuit is connected to an input terminal of the comparison circuit CMP. Positive and negative input terminals of the comparison circuit CMP as well as the positive and negative output terminals of the differential signal amplification circuit are connected by coupling capacitors C3 and C4. When there are high-frequency signals at the two input terminals of the comparison circuit, the comparison circuit outputs a high level. When there is no signal at the two input terminals, the comparison circuit outputs a low level. In this way, outputting of the digital signal RXDATA is completed. An output terminal of the comparison circuit is connected to a digital output terminal RXOUT of the receiver.

The multi-stage amplification circuit includes a multi-stage differential amplifier AMP and a common-mode transient adaptive biasing circuit 200. The multi-stage differential amplifier AMP has a structure as shown in FIG. 3 and includes AMP1-AMPN. The differential amplifiers of each stage include the mirroring structure as shown in FIG. 4. The amplification circuit above the second-stage differential amplifier AMP2 includes the biasing current output terminal as shown in FIG. 5. The positive input terminal and the negative input terminal of a primary differential amplifier AMP1 are connected to the input terminals of the common-mode transient adaptive biasing circuit 200.

The common-mode transient adaptive biasing circuit 200 includes the positive common-mode transient adaptive biasing circuit of FIG. 6 or the negative common-mode transient adaptive biasing circuit shown in FIG. 7. The positive common-mode transient adaptive biasing circuit includes the positive common-mode detection circuit 300 and the adaptive biasing circuit 400. The negative common-mode transient adaptive biasing circuit includes the negative common-mode detection circuit 600 and the adaptive biasing circuit 800. The common-mode transient adaptive biasing circuit 200 is optionally connected to the differential amplifiers above the second stage, AMP2 . . . AMPN, in a one-to-many, many-to-one, or many-to-many manner.

The digital isolator optionally uses the positive common-mode transient adaptive biasing circuit or the negative common-mode transient adaptive biasing circuit separately or connects both in parallel to simultaneously detect and suppress the positive or negative common-mode transient interference signals. The common-mode transient adaptive biasing circuit 200 is configured to detect a common-mode transient interference signal at the positive input terminal RXINP and the negative input terminal RXINN, and provide a biasing current of at least one differential amplifier above the second stage when the common-mode transient interference signals are detected. The biasing currents compensate for amplifier output gain loss caused by common-mode interference, so that signal transmission proceeds normally.

What is claimed is:

1. A differential signal amplification circuit, comprising:
a multi-stage differential amplifier and a common-mode transient adaptive biasing circuit;
wherein a positive input terminal and a negative input terminal of a primary differential amplifier of the multi-stage differential amplifier are connected to an input terminal of the common-mode transient adaptive biasing circuit; and
the common-mode transient adaptive biasing circuit is configured to detect a positive or negative common-mode transient interference signal at the positive input terminal and the negative input terminal, and provide a biasing current of a differential amplifier of at least one stage above a second stage when the positive or negative common-mode transient interference signals are detected.

2. The differential signal amplification circuit according to claim 1, wherein the common-mode transient adaptive biasing circuit comprises a common-mode detection circuit and an adaptive biasing circuit, wherein the common-mode detection circuit is connected to the positive input terminal and the negative input terminal of the primary differential amplifier respectively; and when the common-mode detection circuit detects the positive or negative common-mode transient interference signals at the positive input and the negative input, the adaptive biasing circuit is turned on to form a biasing current loop by the adaptive biasing circuit and the multi-stage differential amplifier.

3. The differential signal amplification circuit according to claim 2, wherein the common-mode detection circuit is configured to detect the positive common-mode transient interference signals, and comprises an NMOS transistor MC1 and an NMOS transistor MC2 that are connected in parallel, wherein gate electrodes of the NMOS transistor MC1 and the NMOS transistor MC2 are respectively connected to the positive input terminal and the negative input terminal of the primary differential amplifier; drain electrodes of the NMOS transistor MC1 and the NMOS transistor MC2 are connected to a biasing current output terminal of the multi-stage differential amplifier; and source electrodes of the NMOS transistor MC1 and the NMOS transistor MC2 are connected to a current input terminal of the adaptive biasing circuit.

4. The differential signal amplification circuit according to claim 3, wherein the adaptive biasing circuit comprises an NMOS transistor MC3 and an NMOS transistor MC4 having their source electrode and the drain electrode connected in series, wherein the drain electrode and the gate electrode of the NMOS transistor MC3 are connected to an output terminal of the common-mode detection circuit; and the source electrode of the NMOS transistor MC4 is connected to ground.

5. The differential signal amplification circuit according to claim 2, wherein the common-mode detection circuit is configured to detect the negative common-mode transient interference signals, and comprises:
a PMOS transistor MD4 and an NMOS transistor MD3 whose drain electrodes are connected in series, wherein a source electrode of the PMOS transistor MD4 is connected to a power supply; and
a PMOS transistor MD1 and a PMOS transistor MD2 that are connected in parallel, wherein source electrodes of the PMOS transistor MD1 and the PMOS transistor MD2 are connected to source electrode of the NMOS transistor MD3;
gate electrodes of the PMOS transistor MD1 and the PMOS transistor MD2 are respectively connected to the positive input terminal and the negative input terminal of the primary differential amplifier; and
drain electrodes of the PMOS transistor MD1 and the PMOS transistor MD2 are connected to a signal input terminal of the adaptive biasing circuit.

6. The differential signal amplification circuit according to claim 5, wherein the adaptive biasing circuit is a current mirror in structure, and a mirroring current output terminal of the current mirror is connected to a biasing current output terminal of the multi-stage differential amplifier.

7. The differential signal amplification circuit according to claim 6, wherein the adaptive biasing circuit comprises an NMOS transistor MD5 and an NMOS transistor MD6 having their gate electrodes connected, wherein source electrodes of the NMOS transistor MD5 and the NMOS transistor MD6 are connected to ground; a drain electrode and a gate electrode of the NMOS transistor MD5 are connected to a signal output terminal of the adaptive biasing circuit; and a drain electrode of the NMOS transistor MD6 is connected to the biasing current output terminal of the multi-stage differential amplifier.

8. The differential signal amplification circuit according to claim 3, wherein the differential amplifier is a mirroring circuit, wherein the mirroring circuit comprises a PMOS transistor MA3 and an NMOS transistor MA1 whose drain electrodes are connected in series on one side;
wherein a source electrode of the PMOS transistor MA3 is connected to a power supply, a capacitor CA1 is connected between a gate electrode and the source electrode of the PMOS transistor MA3, and a biasing resistor RA1 is connected between the gate electrode and a drain electrode of the PMOS transistor MA3; and
a drain electrode of the NMOS transistor MA1 is connected to a negative output terminal of the differential amplifier, and a gate electrode of the NMOS transistor MA1 is connected to the positive input terminal of the differential amplifier; and
the mirroring circuit comprises a PMOS transistor MA4 and an NMOS transistor MA2 whose drain electrodes are connected in series on the other side;
wherein a source electrode of the PMOS transistor MA4 is connected to the power supply, a capacitor CA2 is connected between a gate electrode and the source electrode of the PMOS transistor MA4, and a biasing resistor RA2 is connected between the gate electrode and a drain electrode of the PMOS transistor MA4; and
a drain electrode of the NMOS transistor MA2 is connected to a positive output terminal of the differential amplifier, and a gate electrode of the NMOS transistor MA2 is connected to the negative input terminal of the differential amplifier; and
the source electrodes of the PMOS transistor MA3 and the PMOS transistor MA4 on both sides of the mirroring circuit are connected in parallel, the source electrodes of the NMOS transistor MA1 and the NMOS transistor MA2 on both sides of the mirroring circuit are connected in parallel, and the source electrodes of the NMOS transistor MA1 and the NMOS transistor MA2 are connected to a drain electrode of a grounded NMOS transistor MA5.

9. The differential signal amplification circuit according to claim 8, wherein the differential amplifiers above the second stage comprises at least one stage of differential amplifier in which the source electrodes of the NMOS transistor MA1 and the NMOS transistor MA2 are connected to the biasing current output terminal.

10. The differential signal amplification circuit according to claim 8, wherein the positive input terminal and the negative input terminal of the primary differential amplifier are respectively connected with a resistor R3 and a resistor R4 to a reference level.

11. The differential signal amplification circuit according to claim 1, wherein the positive input terminal and the negative input terminal of the primary differential amplifier are connected to an isolation capacitor Ciso3 and an isolation capacitor Ciso4 in series.

12. A receiver for a digital isolator, comprising a differential signal amplification circuit of claim 1, wherein the positive input terminal and the negative input terminal of the primary differential amplifier are connected to a positive input terminal and a negative input terminal of the digital isolator; the output terminal of the multi-stage differential amplifier is connected to an input terminal of a comparator; and an output terminal of the comparator is connected to an output terminal of the receiver for the digital isolator.

13. A digital isolator, comprising:
a transmitter and a receiver;
wherein the transmitter comprises an oscillator and a transmission driving circuit, the transmission driving circuit having an oscillating signal input terminal connected to the oscillator, a digital input terminal connected to a digital signal input terminal of the transmitter, and an output terminal connected to an output terminal of the transmitter; and
the receiver comprises a comparison circuit and the differential signal amplification circuit of claim 1, the differential signal amplification circuit having an input terminal connected to an input terminal of the receiver and an output terminal connected to an input terminal of the comparison circuit, and an output terminal of the comparison circuit connected to a digital output terminal of the receiver.

* * * * *